(12) United States Patent
Tadokoro et al.

(10) Patent No.: US 8,698,052 B2
(45) Date of Patent: Apr. 15, 2014

(54) TEMPERATURE CONTROL METHOD OF HEAT PROCESSING PLATE, COMPUTER STORAGE MEDIUM, AND TEMPERATURE CONTROL APPARATUS OF HEAT PROCESSING PLATE

(75) Inventors: Masahide Tadokoro, Koshi (JP); Ryoichi Uemura, Koshi (JP); Mitsuteru Yano, Koshi (JP); Shinichi Shinozuka, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/551,307

(22) Filed: Jul. 17, 2012

(65) Prior Publication Data

US 2012/0279955 A1 Nov. 8, 2012

Related U.S. Application Data

(62) Division of application No. 11/748,167, filed on May 14, 2007, now Pat. No. 8,242,417.

(30) Foreign Application Priority Data

May 23, 2006 (JP) ................................ 2006-143087

(51) Int. Cl.
*H05B 1/02* (2006.01)
(52) U.S. Cl.
USPC .......................................... 219/494; 219/483
(58) Field of Classification Search
CPC ........................................................ H05B 1/02
USPC .................. 392/416–418; 219/494, 497, 505, 219/483–487, 121.43, 444.1, 446.1, 219/448.11; 118/724, 725
See application file for complete search history.

(56) References Cited

U.S. PATENT DOCUMENTS

| | | | |
|---|---|---|---|
| 6,090,210 A | 7/2000 | Balance et al. | |
| 6,191,394 B1 | 2/2001 | Shirakawa et al. | |
| 6,612,590 B2 | 9/2003 | Coomer et al. | |
| 6,654,668 B1 * | 11/2003 | Harada et al. | 700/299 |
| 6,863,734 B2 * | 3/2005 | Takano | 118/725 |

FOREIGN PATENT DOCUMENTS

| | | |
|---|---|---|
| JP | 11-329940 | 11/1999 |
| JP | 2001-143850 | 5/2001 |
| JP | 2001-274069 | 10/2001 |
| JP | 2003-282461 | 10/2003 |
| WO | WO 2006/087938 A1 | 8/2006 |

* cited by examiner

*Primary Examiner* — Mark Paschall
(74) *Attorney, Agent, or Firm* — Oblon, Spivak, McClelland, Maier & Neustadt, L.L.P.

(57) ABSTRACT

In the present invention, temperature drop amounts of heating plate regions when the substrate is mounted on a heating plate are detected to detect a warped state of the substrate. From the temperature drop amounts of the heating plate regions, correction values for set temperatures of the heating plate regions are calculated. The calculation of the correction values for the set temperatures of the heating plate regions is performed by estimating steady temperatures within the substrate to be heat-processed on the heating plate from the temperature drop amounts of the heating plate regions using a correlation obtained in advance. From the estimated steady temperatures within the substrate and the temperature drop amounts of the heating regions, the correction values for the set temperatures of the heating plate regions are calculated. Based on the correction values for the set temperatures, the set temperatures of the heating plate regions are changed.

20 Claims, 14 Drawing Sheets

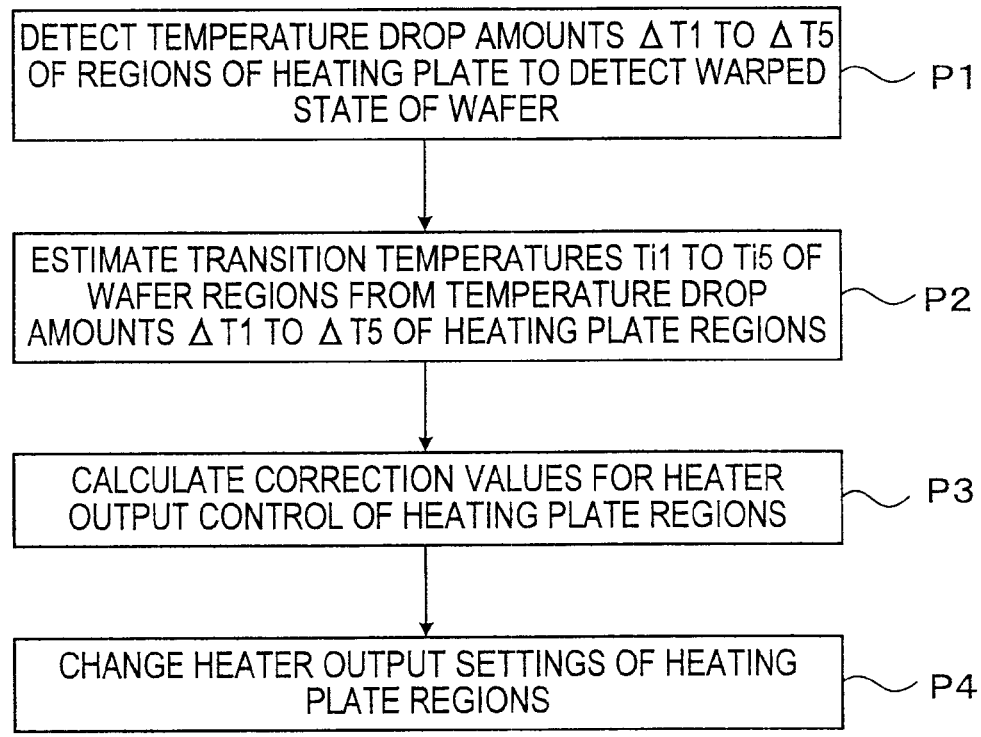
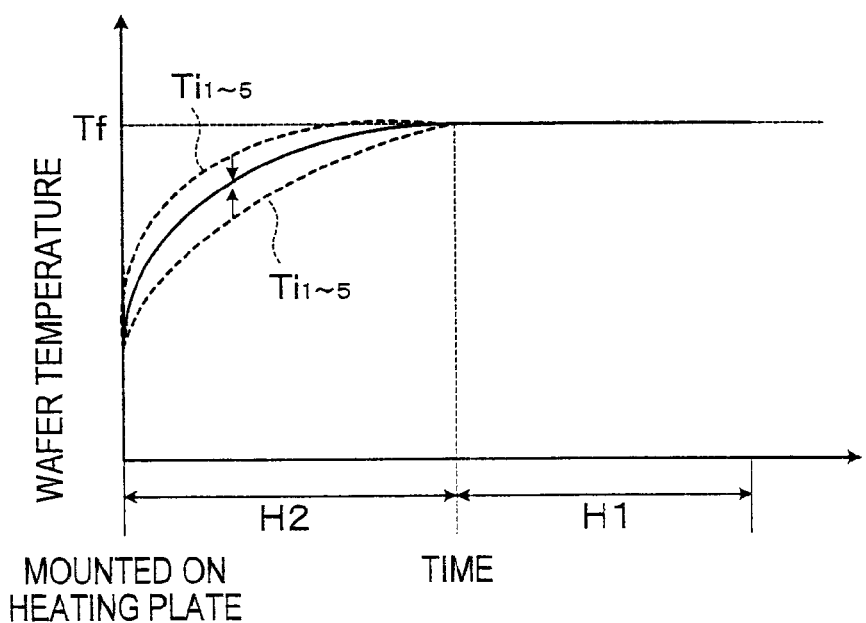

TEMPERATURE CONTROL METHOD OF HEAT PROCESSING PLATE, COMPUTER STORAGE MEDIUM, AND TEMPERATURE CONTROL APPARATUS OF HEAT PROCESSING PLATE

CROSS-REFERENCE TO RELATED APPLICATIONS

This application is a division of application Ser. No. 11/748,167, filed May 14, 2007, the entire contents of which is incorporated herein by reference. Application Ser. No. 11/748,167 claims the benefit of priority under 35 U.S.C. §119 from Japanese Patent Application No. JP 2006-143087 filed May 23, 2006.

BACKGROUND OF THE INVENTION

1. Field of the Invention

The present invention relates to a temperature control method of a heat processing plate, a computer storage medium, and a temperature control apparatus of a heat processing plate.

2. Description of the Related Art

In a photolithography process in manufacturing, for example, a semiconductor device, for example, a resist coating treatment for applying a resist solution onto a wafer to form a resist film, exposure processing for exposing the resist film into a predetermined pattern, heat processing for accelerating the chemical reaction in the resist film after exposure (post-exposure baking), and developing treatment for developing the exposed resist film are performed in sequence to form a predetermined resist pattern on the wafer. A series of these processing and treatment are successively performed in a coating and developing treatment system including a number of processing and treatment units for performing various kinds of processing and treatments.

The heat processing such as the above-described post-exposure baking is usually performed in a heat processing apparatus. The heat processing apparatus includes a heating plate for mounting and heating the wafer thereon. The heating plate has a heater embedded therein which generates heat by power feeding, and the heat generation by the heater adjusts the heating plate to a desired temperature.

The processing temperature for the wafer in the above-described heat processing greatly affects the line width of the resist pattern to be finally formed on the wafer. Hence, to strictly control the temperature within the wafer during heating, the heating plate of the above-described heat processing apparatus is divided into a plurality of regions, and an independent heater is embedded in each of the regions to adjust the temperature for each of the regions (Japanese Patent Application Laid-open No. 2001-143850).

SUMMARY OF THE INVENTION

However, some wafers which will be subjected to processing on a heating plate may have warpage due to pre-processing such as film formation or etching. To the wafer with warpage, heat of the heating plate is not uniformly conducted during heat-processing, and a part of the wafer will not be heated at a proper temperature. In this case, the line width of the resist pattern finally formed on the wafer will vary. Hence, it is conceivable that a dedicated warpage measuring unit having a laser displacement gauge is installed, for example, in the coating and developing system so that the warpage measuring unit is used to measure the warpage amount of the wafer so as to adjust the temperatures of the regions of the heating plate according to the warpage amount.

However, an improvement in uniformity in line width can be expected to a certain degree, but it is necessary to accurately grasp the warped state of the wafer when the wafer is actually mounted on the heating plate in order to further improve the uniformity in line width. However, it is technically difficult to implement, for example, the laser displacement gauge of the warpage measuring unit on the heating plate during heating. In addition, installation of the dedicated warpage measuring unit in the coating and developing treatment system requires an accordingly increased space and results in increased cost.

The present invention has been developed in consideration of the viewpoint, and its object is to appropriately perform temperature control of a heat processing plate such as a heating plate according to the warpage of a substrate such as a wafer without using a dedicated warpage measuring unit.

The present invention to achieve the above object is a temperature control method of a heat processing plate for mounting and heat-processing a substrate thereon, the heat processing plate being divided into a plurality of regions and temperature-controllable for each of the regions, the method including the steps of: detecting temperature drop amounts within the heat processing plate when mounting the substrate on the heat processing plate to detect a warped state of the substrate; and controlling temperatures of the regions of the heat processing plate based on the warped state of the substrate.

According to the present invention, it is not necessary to use a dedicated warpage measuring unit, and therefore the cost can be reduced. Further, since the temperatures within the heat processing plate can be strictly controlled based on the warped state of the substrate when the substrate is actually mounted on the heat processing plate, the heat processing within the substrate can be performed further uniformly to thereby improve the uniformity within the surface that is a result of final processing of the substrate.

According to another aspect, the present invention is a computer storage medium storing a computer program for controlling a heat processing plate divided into a plurality of regions and temperature-controllable for each of the regions. The control of the heat processing plate includes the steps of: detecting temperature drop amounts within the heat processing plate when mounting the substrate on the heat processing plate to detect a warped state of the substrate; and controlling temperatures of the regions of the heat processing plate based on the warped state of the substrate.

According to still another aspect, the present invention is a temperature control apparatus of a heat processing plate for mounting and heat-processing a substrate thereon, the heat processing plate being divided into a plurality of regions and temperature-controllable for each of the regions, the apparatus including: a detecting unit for detecting temperature drop amounts within the heat processing plate when the substrate is mounted on the heat processing plate to detect a warped state of the substrate; and a control unit for controlling temperatures of the regions of the heat processing plate based on the warped state of the substrate.

According to the present invention, it is not necessary to use a dedicated warpage measuring unit, and therefore the cost can be reduced. Further, since the temperature control within the heat processing plate can be appropriately conducted, the uniformity within the surface of the substrate processing can be improved to increase yields.

BRIEF DESCRIPTION OF THE DRAWINGS

FIG. 17 is a flowchart showing the temperature control process of controlling a transition temperature; and FIG. 18 is a graph showing temperature fluctuations of the wafer during heat processing when the settings of the transition temperatures are changed.

DETAILED DESCRIPTION OF THE INVENTION

Figure 1:
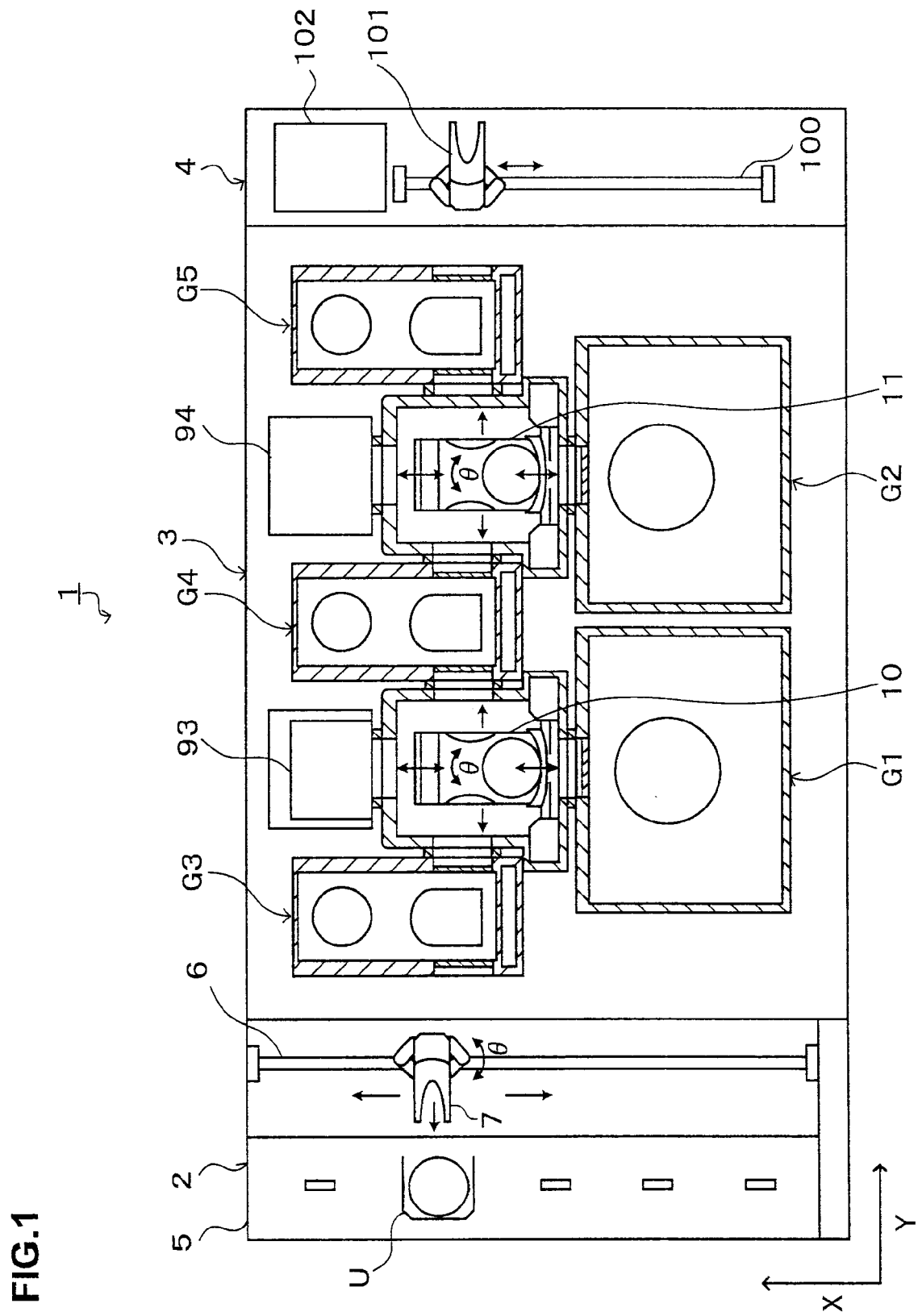
FIG. 1 is a plan view showing the outline of a configuration of a coating and developing treatment system for implementing the present embodiment.
Figure 2:
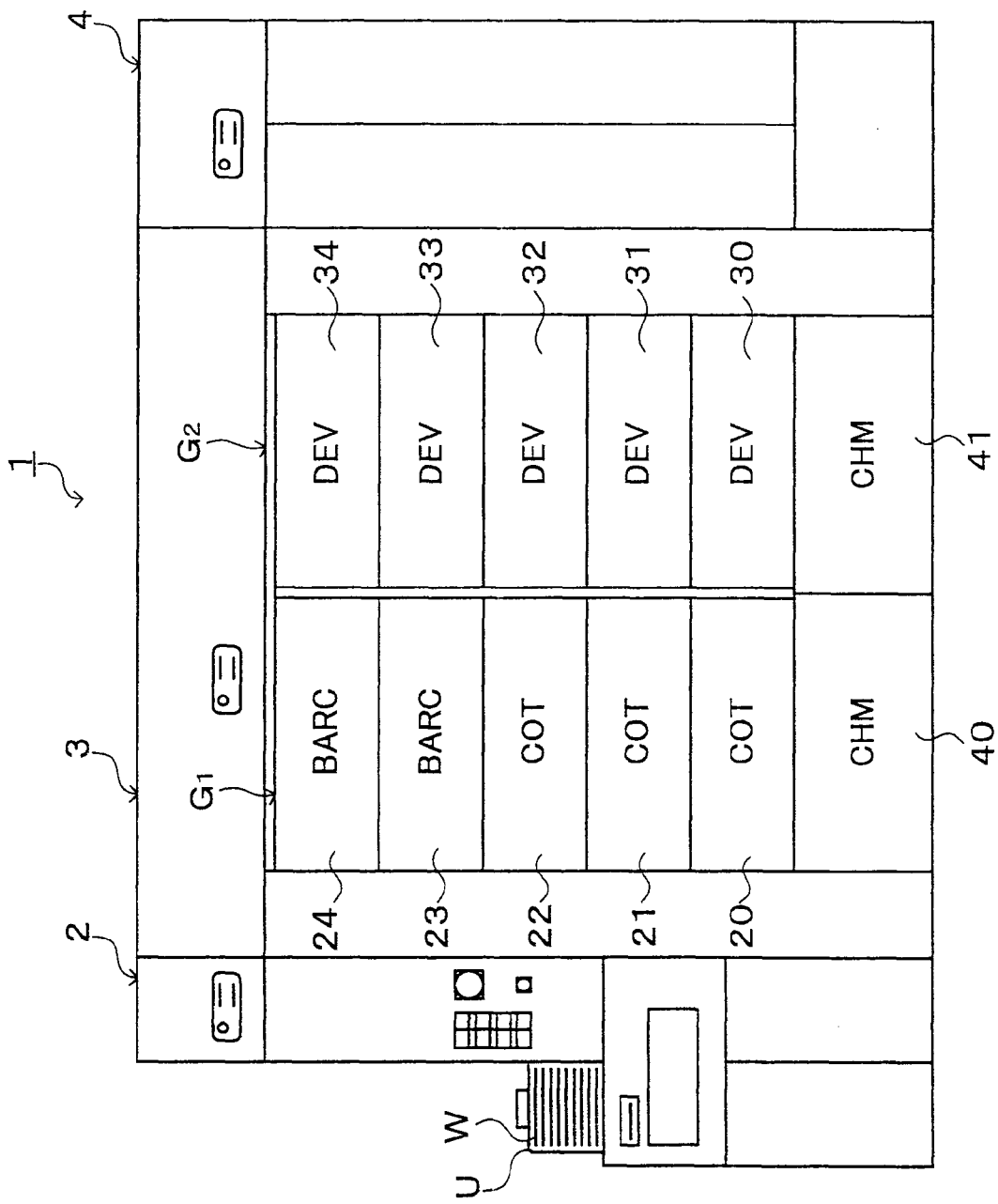
FIG. 2 is a front view of the coating and developing treatment system in FIG. 1.
Figure 3:
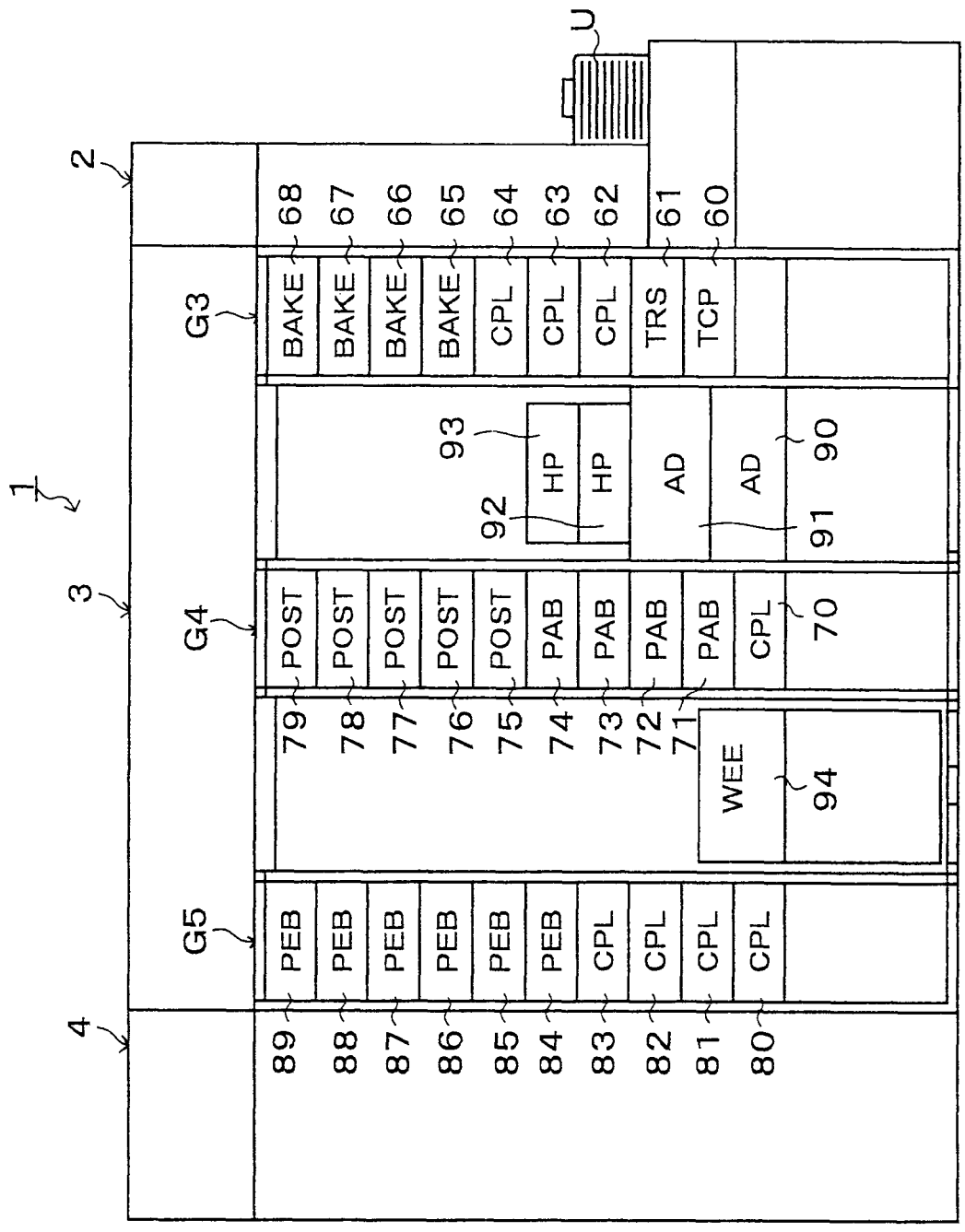
FIG. 3 is a rear view of the coating and developing treatment system in FIG. 1.

Hereinafter, a preferred embodiment of the present invention will be described. FIG. 1 is a plan view showing the outline of a configuration of a coating and developing treatment system 1 incorporating a temperature controller of a heat processing plate according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette U; a processing station 3 including a plurality of various kinds of processing and treatment units, which are multi-tiered, for performing predetermined processing or treatment in a manner of single wafer processing in the photolithography process; and an interface section 4 for delivering the wafers W to/from a not-shown aligner provided adjacent to the processing station 3, are integrally connected together.

In the cassette station 2, a cassette mounting table 5 is provided and configured such that a plurality of cassettes U can be mounted thereon in a line in an X-direction (a top-to-bottom direction in FIG. 1). In the cassette station 2, a wafer transfer body 7 is provided which is movable in the X-direction on a transfer path 6. The wafer transfer body 7 is also movable in a wafer-arrangement direction of the wafers W housed in the cassette U (a Z-direction; the vertical direction), and thus can selectively access the wafers W in each of the cassettes U arranged in the X-direction.

The wafer transfer body 7, which is rotatable in a Θ-direction around the Z-axis, can access a temperature regulating unit 60 and a transition unit 61 included in a later-described third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit 10 is provided. The first transfer unit 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 11 is provided. The second transfer unit 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light at the time of exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for temperature-regulating the wafer W under temperature control with a high precision, and high-temperature heat processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of heat processing units each for heat-processing the wafer W, for example, high-precision temperature regulating units 80 to 83, and post-exposure baking units (hereinafter, referred to as "PEB units") 84 to 89 each for heat-processing the wafer W after exposure and before development, are ten-tiered in order from the bottom.

As shown in FIG. 1, on the positive direction side in the X-direction of the first transfer unit 10, a plurality of processing and treatment units are arranged, for example, adhesion units 90 and 91 each for performing hydrophobic treatment on the wafer W and heating units 92 and 93 each for heating the wafer W being four-tiered in order from the bottom as shown in FIG. 3. As shown in FIG. 1, on the positive side in the X-direction of the second transfer unit 11, for example, an edge exposure unit 94 is disposed which selectively exposes only the edge portion of the wafer W to light.

In the interface section 4, for example, a wafer transfer body 101 moving on a transfer path 100 extending in the X-direction and a buffer cassette 102 are provided as shown in FIG. 1. The wafer transfer body 101 is vertically movable and also rotatable in the O-direction, and thus can access the not-shown aligner adjacent to the interface section 4, the buffer cassette 102, and the fifth processing unit group G5 and transfer the wafer W to them.

In the coating and developing treatment system 1, for example, the following wafer processing in the photolithography process is performed. First of all, unprocessed wafers W are taken out by the wafer transfer body 7 one by one from the cassette U on the cassette mounting table 5, and transferred to the temperature regulating unit 60 in the third processing unit group G3. The wafer W transferred to the temperature regulating unit 60 is temperature-regulated to a predetermined temperature, and is then transferred by the first transfer unit 10 to the bottom coating unit 23 where an anti-reflection film is formed. The wafer W having the anti-reflection film formed thereon is transferred by the first transfer unit 10 to the heating unit 92, the high-temperature heat processing unit 65, and the high-precision temperature regulating unit 70 in sequence so that predetermined processing is performed in each of the units. Thereafter, the wafer W is transferred to the resist coating unit 20 where a resist film is formed on the wafer W, and then transferred by the first transfer unit 10 to the pre-baking unit 71 where the wafer W is subjected to pre-baking processing.

Subsequently, the wafer W is transferred by the second transfer unit 11 to the edge exposure unit 94 and the high-precision temperature regulating unit 83 in sequence so that the wafer W is subjected to predetermined processing in each of the units. The wafer W is then transferred by the wafer transfer body 101 in the interface section 4 to the not-shown aligner where the wafer is exposed to light. The wafer W for which exposure processing has been finished is transferred by the wafer transfer body 101, for example, to the PEB unit 84 where the wafer W is subjected to post-exposure baking processing, and then transferred by the second transfer unit 11 to the high-precision temperature regulating unit 81 where the wafer W is temperature-regulated. The wafer W is transferred to the developing treatment unit 30 where the resist film is developed. The wafer W is then transferred by the second transfer unit 11 to the post-baking unit 75 where the wafer W is subjected to post-baking. The wafer W is then transferred to the high-precision temperature regulating unit 63 where the wafer W is temperature-regulated. The wafer W is then transferred by the first transfer unit 10 to the transition unit 61 and returned to the cassette U by the wafer transfer body 7, thus completing a series of steps of the wafer processing.

Figure 4:
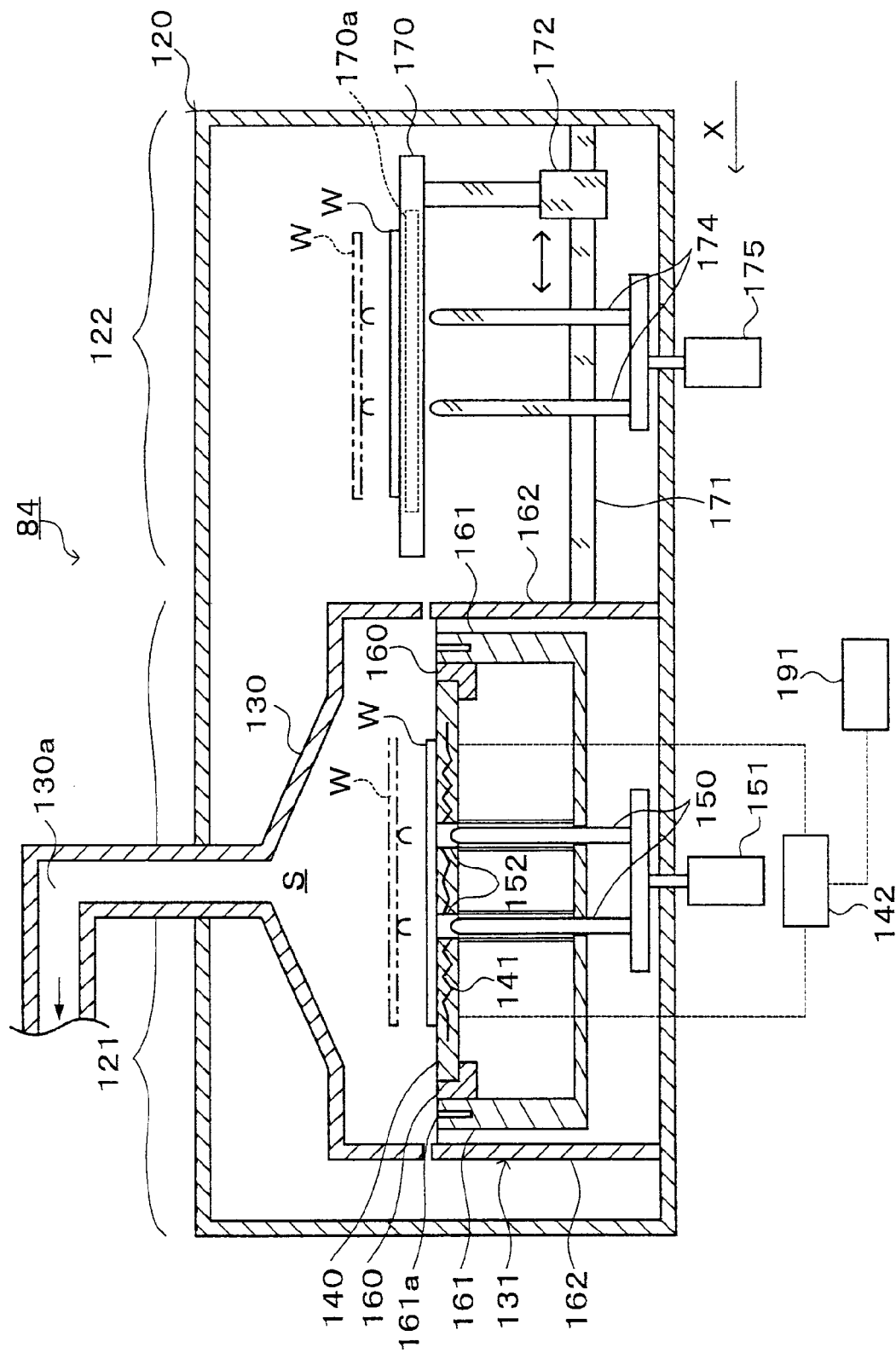
FIG. 4 is an explanatory view of a longitudinal section showing the outline of a configuration of a PEB unit.
Figure 5:
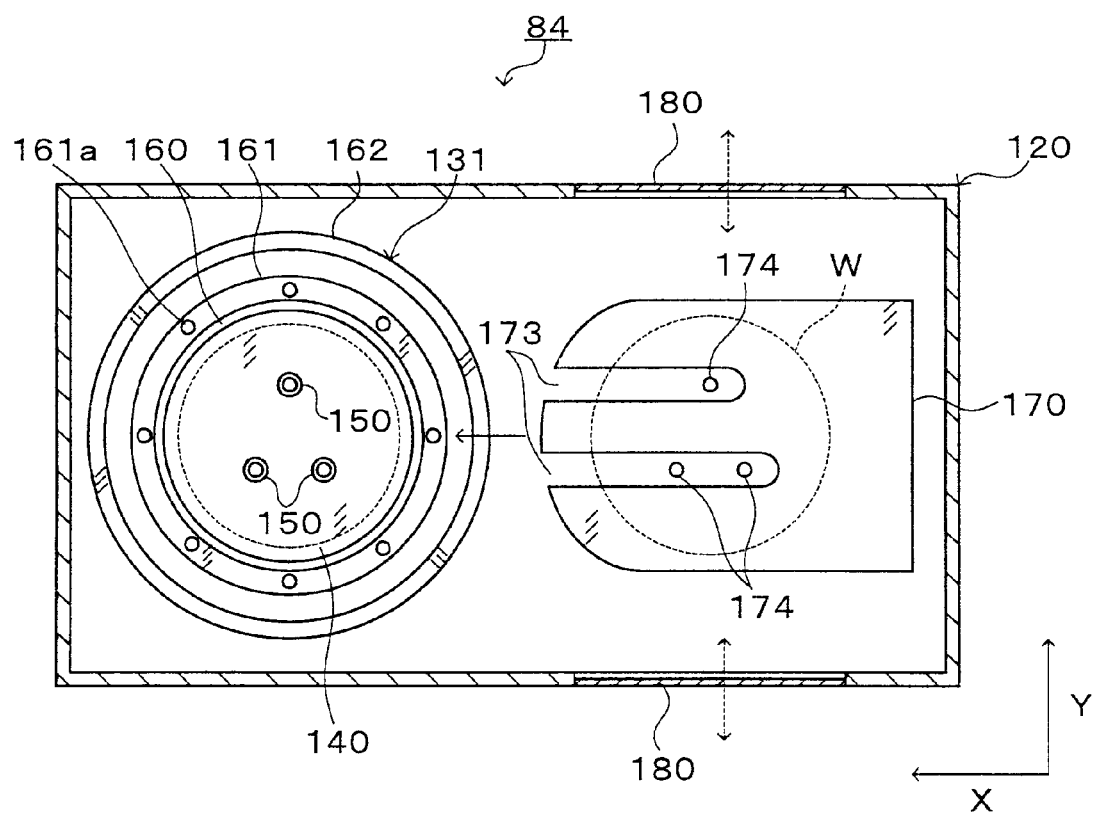
FIG. 5 is an explanatory view of a transverse section showing the outline of a configuration of the PEB unit.

Next, the configuration of the aforementioned PEB unit 84 will be described. As shown in FIG. 4 and FIG. 5, the PEB unit 84, for example, comprises a heating section 121 for heating the wafer W and a cooling section 122 for cooling the wafer W in a housing 120.

The heating section 121 has, as shown in FIG. 4, a lid body 130 that is located on the upper side and vertically movable, and a heating plate accommodating unit 131 that is located on the lower side and forms a processing chamber S together with the lid body 130.

The lid body 130 has an almost conical shape gradually increasing in height toward its central portion, and is provided with an exhaust portion 130a at its top portion. The atmosphere in the processing chamber S is uniformly exhausted through the exhaust portion 130a.

At the center of the heating plate accommodating unit 131, a heating plate 140 is provided as a heat processing plate for mounting and heating the wafer W thereon. The heating plate 140 has an almost disk shape with a large thickness.

Figure 6:
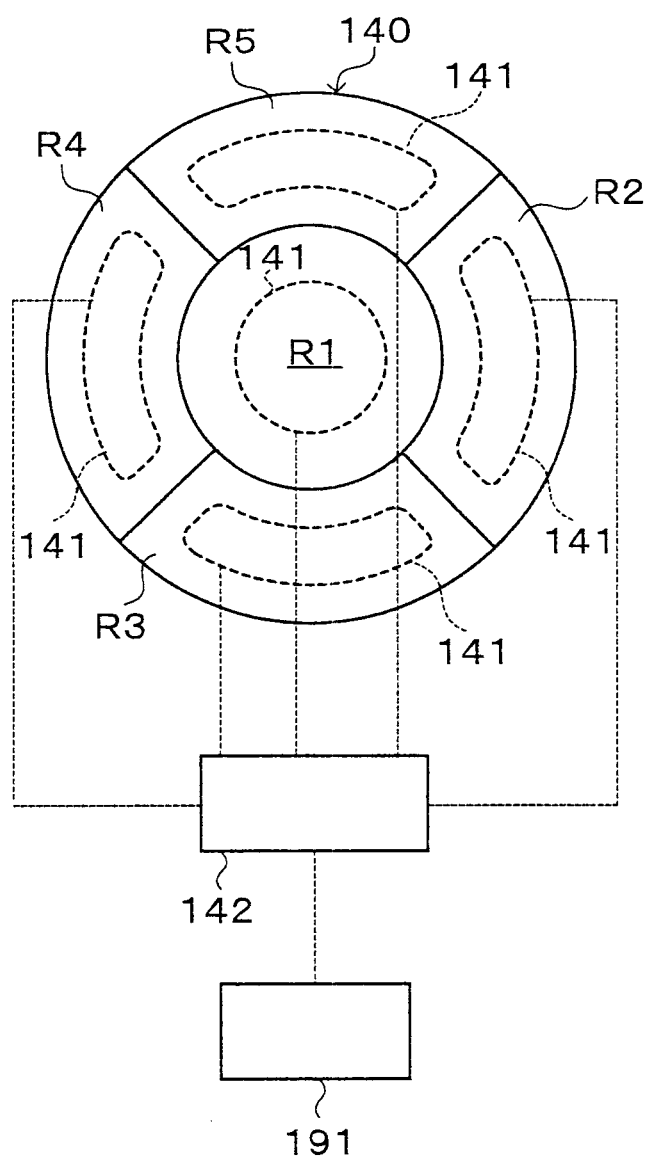
FIG. 6 is a plan view showing a configuration of a heating plate in the PEB unit.

The heating plate 140 is divided into a plurality of, for example, five heating plate regions $R_1$, $R_2$, $R_3$, $R_4$ and $R_5$ as shown in FIG. 6. The heating plate 140 is divided, for example, into the circular heating plate region $R_1$ which is located at the central portion as seen in plan view and the heating plate regions $R_2$ to $R_5$ which are made by equally dividing the peripheral portion around the heating plate region $R_1$ into four sectors.

A heater 141 generating heat by power feeding is individually embedded in each of the heating plate regions $R_1$ to $R_5$ of the heating plate 140 and can heat each of the heating plate regions $R_1$ to $R_5$. The heating value of each of the heaters 141 of the heating plate regions $R_1$ to $R_5$ is adjusted, for example, by a heater controller 142. The heater controller 142 can adjust the heating value of each of the heaters 141 to control each of the heating plate regions $R_1$ to $R_5$ to a predetermined temperature. The temperature control in the heater controller 142 is performed, for example, by a control unit 191 of a later-described temperature controller 190.

Figure 7:
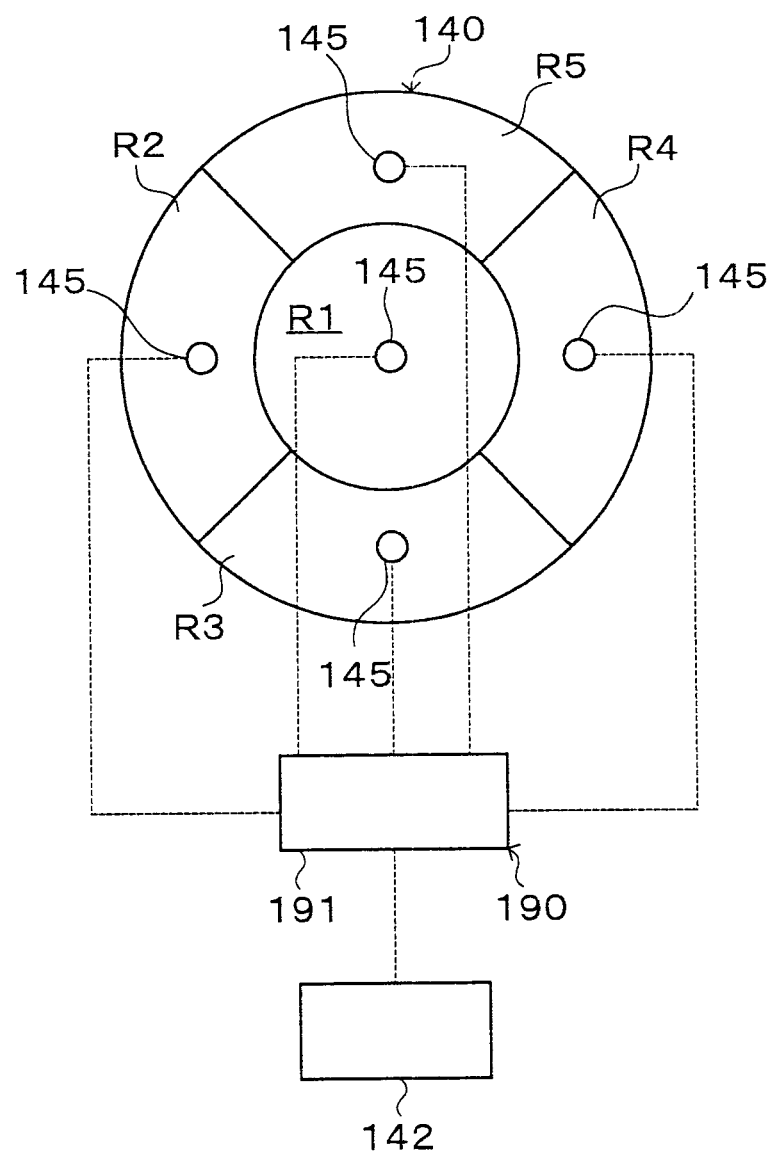
FIG. 7 is a rear view of the heating plate on which temperature sensors are arranged.

On the rear surface side of the heating plate regions $R_1$ to $R_5$ of the heating plate 140, temperature sensors 145 are provided as detection units for detecting temperatures of the regions, respectively, as shown in FIG. 7. The temperature sensors 145 can detect later-described temperature drop amounts of the heating plate regions $R_1$ to $R_5$ when the wafer W is mounted on the heating plate 140. The temperature detection results by the temperature sensors 145 can be outputted, for example, to the control unit 191 of the temperature controller 190.

As shown in FIG. 4, raising and lowering pins 150 for supporting the lower side of the wafer W and raising and lowering the wafer W are provided below the heating plate 140. The raising and lowering pins 150 are configured to be vertically movable by means of a raising and lowering drive mechanism 151. Near the central portion of the heating plate 140, through holes 152 are formed which pass through the heating plate 140 in its thickness direction. The raising and lowering pins 150 can rise from below the heating plate 140 and pass through the through holes 152 to project to above the heating plate 140 and support the wafer W.

The heating plate accommodating unit 131 has an annular holding member 160 for accommodating the heating plate 140 and holding the outer peripheral portion of the heating plate 140, and a support ring 161 almost in a cylindrical shape surrounding the outer periphery of the holding member 160. The upper surface of the support ring 161 is formed with a blow port 161a for jetting, for example, an inert gas toward the inside of the processing chamber S. The jetting of the inert gas from the blow port 161a can purge the processing chamber S. Further, outside the support ring 161, a case 162 in a cylindrical shape is provided which is an outer periphery of the heating plate accommodating unit 131.

In the cooling section 122 adjacent to the heating section 121, for example, a cooling plate 170 is provided which mounts and cools the wafer W thereon. The cooling plate 170 has, for example, an almost square flat-plate shape as shown in FIG. 5 with its end face on the heating section 121 side curved in an arc shape. As shown in FIG. 4, inside the cooling plate 170, for example, a cooling member 170a such as a Peltier element is embedded and can adjust the cooling plate 170 to a predetermined preset temperature.

The cooling plate 170 is attached to a rail 171 extending toward the heating section 121 side. The cooling plate 170 can move on the rail 171 by means of a drive unit 172 to a position above the heating plate 140 on the heating section 121 side.

The cooling plate 170 is formed with, for example, two slits 173 along the X-direction, for example, as shown in FIG. 5. The slits 173 are formed from the end surface on the heating section 121 side of the cooling plate 170 to the vicinity of the central portion of the cooling plate 170. The slits 173 prevent the cooling plate 170 which has moved to the heating section 121 side from interfering with the first raising and lowering pins 150 projecting to above the heating plate 140. As shown in FIG. 4, second raising and lowering pins 174 are provided below the cooling plate 170 located in the cooling section 122. The second raising and lowering pins 174 can be raised and lowered by a raising and lowering drive unit 175. The second raising and lowering pins 174 can rise from below the cooling plate 170, pass through the slits 173, and project to above the cooling plate 170 to support the wafer W.

As shown in FIG. 5, both side surfaces of the housing 120 across the cooling plate 170 are formed with transfer-in/out ports 180 for transferring-in/out the wafer W.

In the PEB unit 84, a wafer W is first transferred-in through the transfer-in/out port 180 and mounted on the cooling plate 170. The cooling plate 170 is subsequently moved so that the wafer W is moved to a position above the heating plate 140. The wafer W is mounted onto the heating plate 140 by the first raising and lowering pins 150, so that the wafer W is heated. After a lapse of a predetermined time, the wafer W is then passed from the heating plate 140 again to the cooling plate 170 to be cooled, and transferred from the cooling plate 170 to the outside of the PEB unit 84 through the transfer-in/out port 180, with which a series of heat processing ends.

Next, the configuration of the temperature controller 190 for performing temperature control of the heating plate 140 in the above-described PEB unit 84 will be described. The temperature controller 190 in the embodiment is composed of, for example, the temperature sensors 145 and the control unit 191 shown in FIG. 7. For example, the control unit 191 is composed of a general-purpose computer including, for example, a CPU and a memory, and is connected to the heater controller 142 of the heating plate 140.

Figure 8:
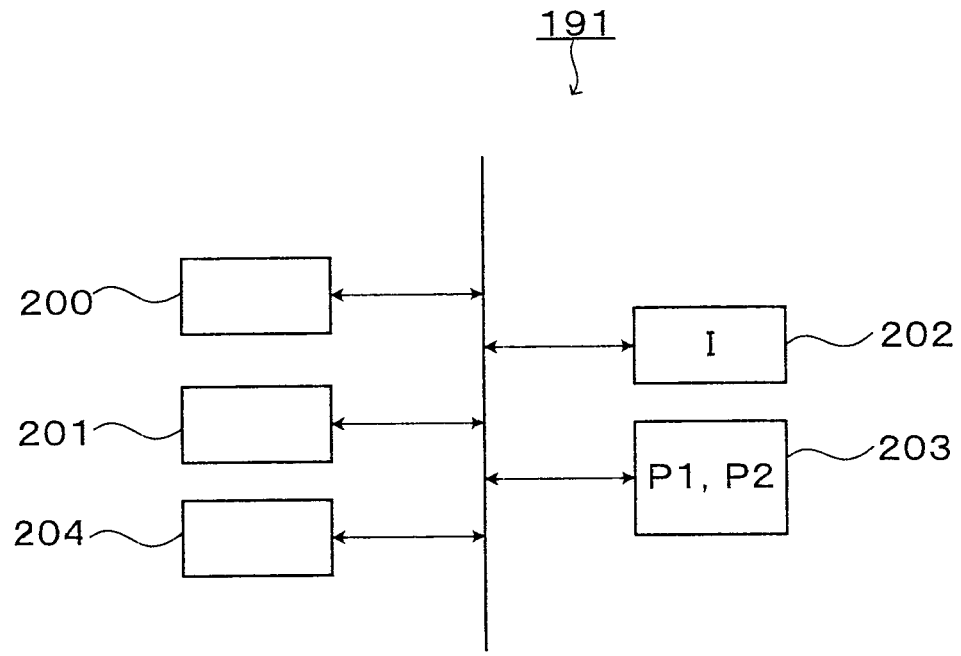
FIG. 8 is a block diagram showing a configuration of a control unit.

The control unit 191 comprises, for example, as shown in FIG. 8, a calculation unit 200 for executing various kinds of programs; an input unit 201 for inputting, for example, various kinds of information for temperature control; a data storage unit 202 for storing various kinds of information for temperature control; a program storage unit 203 for storing various kinds of programs for temperature control; and a communication unit 204 for communicating with the heater controller 142 to change the setting of the temperature control of the heating plate 140.

Figure 9:
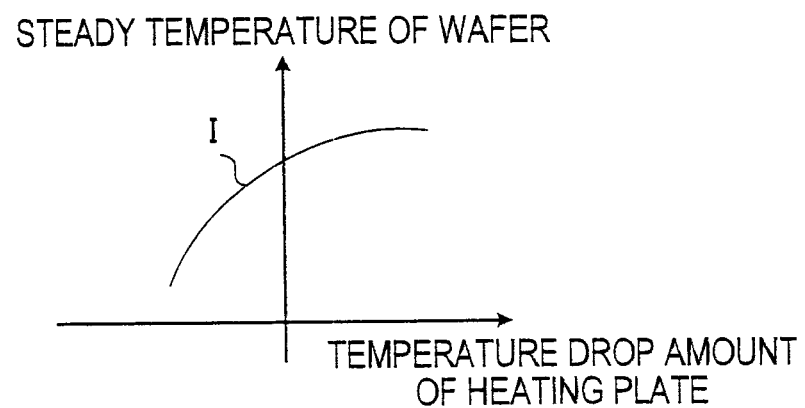
FIG. 9 is a graph showing a correlation between a steady temperature of the wafer and a temperature drop amount of the heating plate.
Figure 10:
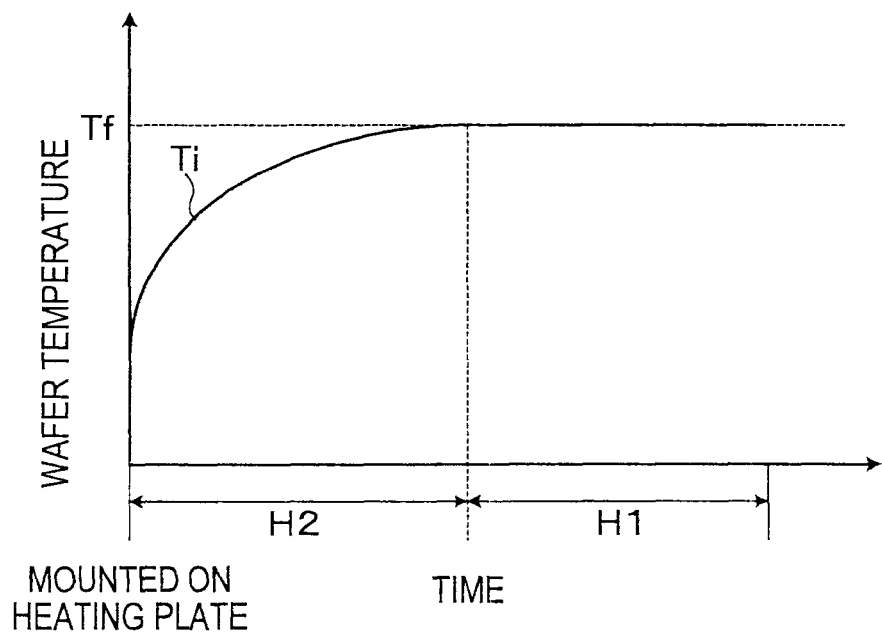
FIG. 10 is a graph showing a temperature fluctuation of the wafer during heat processing.

The data storage unit 202, for example, stores a correlation I between the temperature drop amount of the heating plate 140 when the wafer W is mounted thereon and the steady temperature of the wafer W when heated on the heating plate 140 as shown in FIG. 9. Note that the steady temperature means a temperature Tf during a stable period H1 during which the temperature of the wafer W mounted on the heating plate 140 is increased by the heat of the heating plate 140 and stabilized as shown in FIG. 10.

The program storage unit 203 shown in FIG. 8 stores a program P1 to estimate a steady temperature distribution within the wafer during heating from the temperature drop amounts of the heating plate regions $R_1$ to $R_5$ when the wafer W is mounted on the heating plate 140 and calculate correction values for the set temperatures of the heating plate regions $R_1$ to $R_5$ from the steady temperature distribution within the wafer.

The program storage unit 203 further stores a program P2 to change the existing set temperature in the heater controller 142, for example, based on the calculated correction value for the set temperature. Note that the various kinds of programs for embodying the functions of the control unit 191 may be installed in the control unit 191 by a computer-readable recording medium.

The aforementioned program P1 will be described in detail here.

Figure 11:
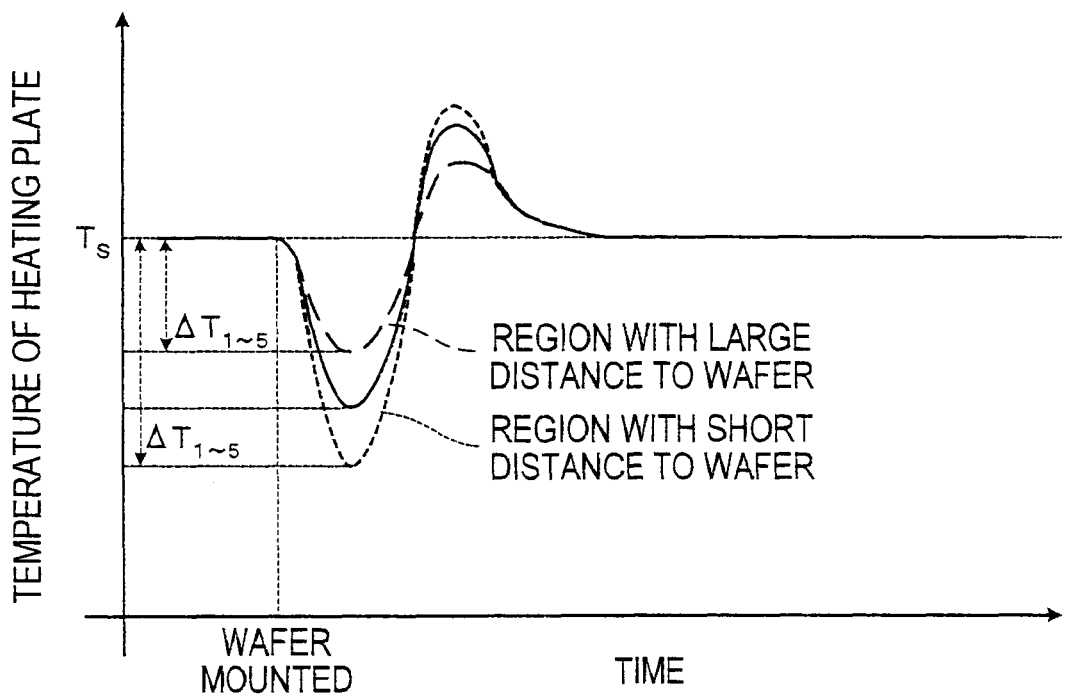
FIG. 11 is a graph showing temperature fluctuations of the heating plate during heat processing.
Figure 12A:
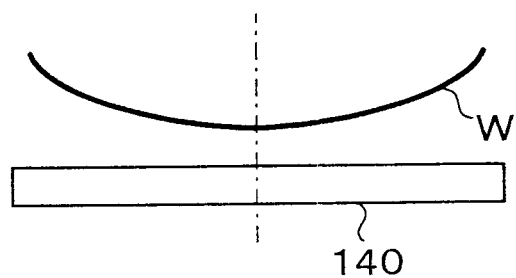
FIG. 12A is an explanatory view showing the state in which the wafer on the heating plate concavely warps.
Figure 12B:
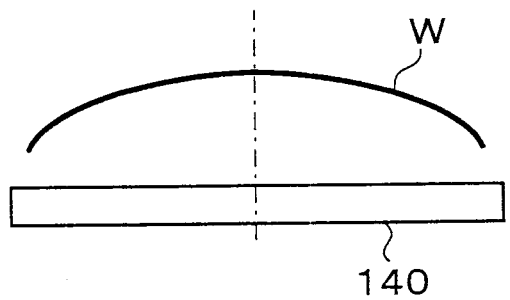
FIG. 12B is an explanatory view showing the state in which the wafer on the heating plate convexly warps.

When the wafer W is mounted on the surface of the heating plate 140, heat of the heating plate 140 is temporarily drawn by the wafer W at a lower temperature, whereby the temperature of the heating plate 140 drops as shown in FIG. 11. Since the more heat is drawn as the distance between the wafer W and the heating plate 140 is shorter, the temperature drop amounts $\Delta T_1$ to $\Delta T_5$ of the heating plate regions $R_1$ to $R_5$ can be detected to thereby detect the distances between the heating plate regions $R_1$ to $R_5$ and the wafer W, that is, the warped state of the wafer W. For example, when the temperature drop amount $\Delta T_1$ of the heating plate region $R_1$ corresponding to a central portion of the wafer W is large and the temperature drop amounts $\Delta T_2$ to $\Delta T_5$ of the heating plate regions $R_2$ to $R_5$ corresponding to an outer peripheral portion of the wafer W are small, the central portion of the wafer W is closer to the heating plate 140 as compared to the outer peripheral portion side as shown in FIG. 12A, resulting in the warped shape of the wafer W in a concave form curved protruding downward. On the other hand, when the temperature drop amount $\Delta T_1$ of the heating plate region $R_1$ is small and the temperature drop amounts $\Delta T_2$ to $\Delta T_5$ of the heating plate regions $R_2$ to $R_5$ are large, the central portion of the wafer W is farther from the heating plate 140 as compared to the outer peripheral portion side as shown in FIG. 12B, resulting in the warped shape of the wafer W in a convex form curved protruding upward.

The program P1 can estimate the steady temperatures of wafer regions $W_1$ to $W_5$ (a steady temperature distribution within the wafer) on the heating plate 140 using the correlation I from the temperature drop amounts $\Delta T_1$ to $\Delta T_5$ within the heating plate showing the warped state of the wafer W. The wafer regions $W_1$ to $W_5$ are regions corresponding to the heating plate regions $R_1$ to $R_5$ when the wafer W is mounted on the heating plate 140, respectively.

Figure 13:
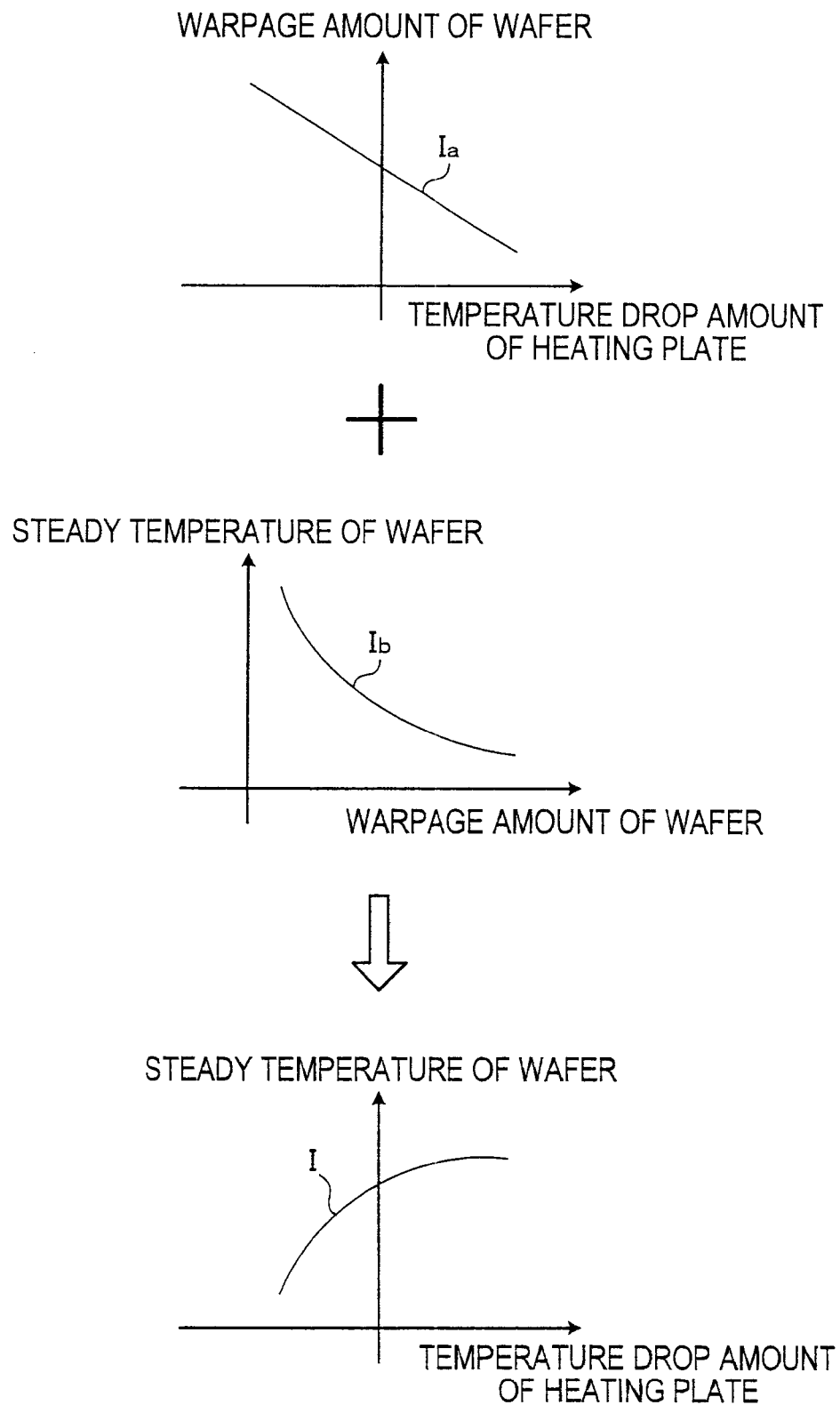
FIG. 13 is an explanatory view showing a calculation example of a correlation between the steady temperature of the wafer and the temperature drop amount of the heating plate.

The correlation I is obtained from a correlation Ia between the temperature drop amount of the heating plate 140 and the warpage amount of the wafer W (the distance between the wafer W and the heating plate 140) and a correlation Ib between the warpage amount of the wafer W and the steady temperature of the wafer W as shown in FIG. 13. The correlations Ia and Ib are obtained by experiments performed in advance.

Figure 14:
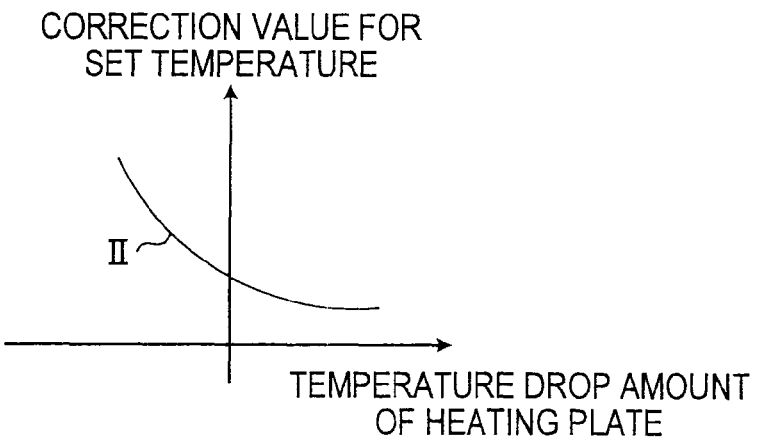
FIG. 14 is a graph showing a correlation between a correction value for the heating plate and the temperature drop amount of the heating plate.

The program P1 can calculate the correction values for the set temperatures of the heating plate regions $R_1$ to $R_5$ to eliminate variations in the steady temperatures from the steady temperatures of the wafer regions $W_1$ to $W_5$ estimated using the correlation I. More specifically, for example, the correlation I between the temperature drop amount of the heating plate 140 and the steady temperature of the wafer W can be inverted in function to obtain a correlation II between the temperature drop amount of the heating plate 140 and the correction value for the set temperature as shown in FIG. 14, so that the correlation II can be used to calculate the correction values for the set temperatures of the heating plate regions $R_1$ to $R_5$.

Figure 15:
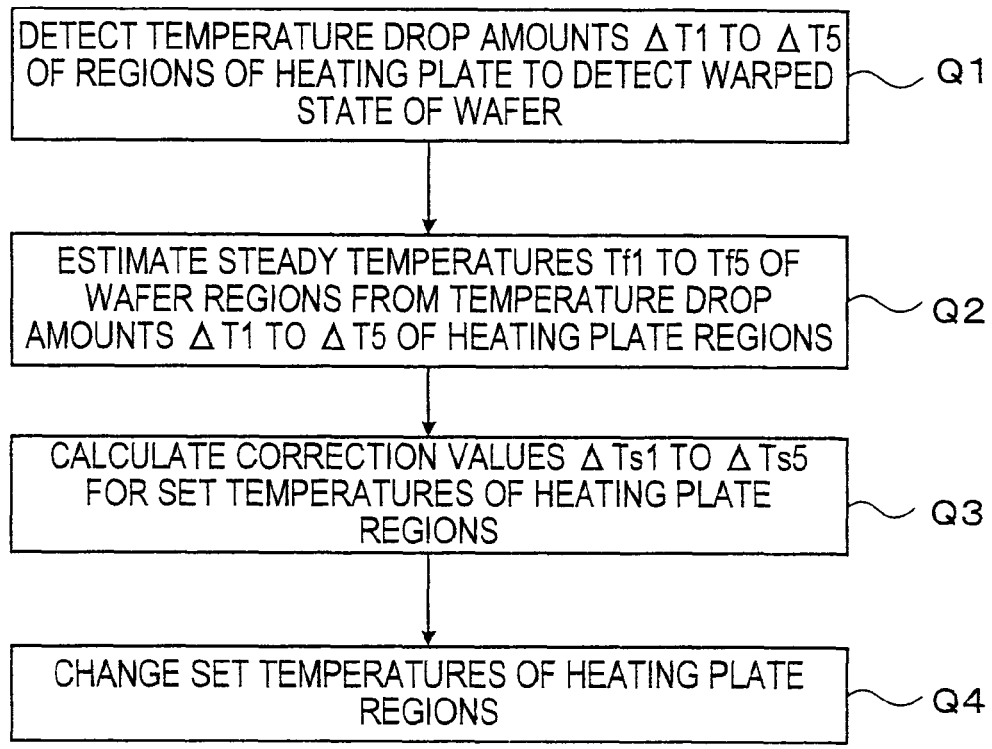
FIG. 15 is a flowchart showing a temperature control process.

Next, the temperature control process of the heating plate 140 in the PEB unit 84 will be described using the temperature controller 190 configured as described above. FIG. 15 is a flowchart showing the temperature control process.

First of all, when the wafer W for which exposure processing has been finished is transferred into the PEB unit 84 and mounted on the heating plate 140 in the coating and developing treatment system 1, for example, the temperature drop amounts $\Delta T_1$ to $\Delta T_5$ of the heating plate regions $R_1$ to $R_5$ of the heating plate 140 are detected by the temperature sensors 145. This detects the warped state of the wafer W (Step Q1 in FIG. 15).

The data on the temperature drop amounts $\Delta T_1$ to $\Delta T_5$ of the heating plate regions $R_1$ to $R_5$ is outputted to the control unit 191. The control unit 191 estimates steady temperatures $Tf_1$ to $Tf_5$ of the wafer regions $W_1$ to $W_5$ using the correlation I from the temperature drop amounts $\Delta T_1$ to $\Delta T_5$ of the heating plate regions $R_1$ to $R_5$ (Step Q2 in FIG. 15). The control unit 191 then calculates the correction values $\Delta Ts_1$ to $\Delta Ts_5$ for the set temperatures Ts of the heating plate regions $R_1$ to $R_5$, for example, using the correlation II from the steady temperature distribution within the wafer and the temperature drop amounts within the heating plate (Step Q3 in FIG. 15). The correction values $\Delta Ts_1$ to $\Delta Ts_5$ are calculated to eliminate the variations in the steady temperatures $Tf_1$ to $Tf_5$.

Figure 16:
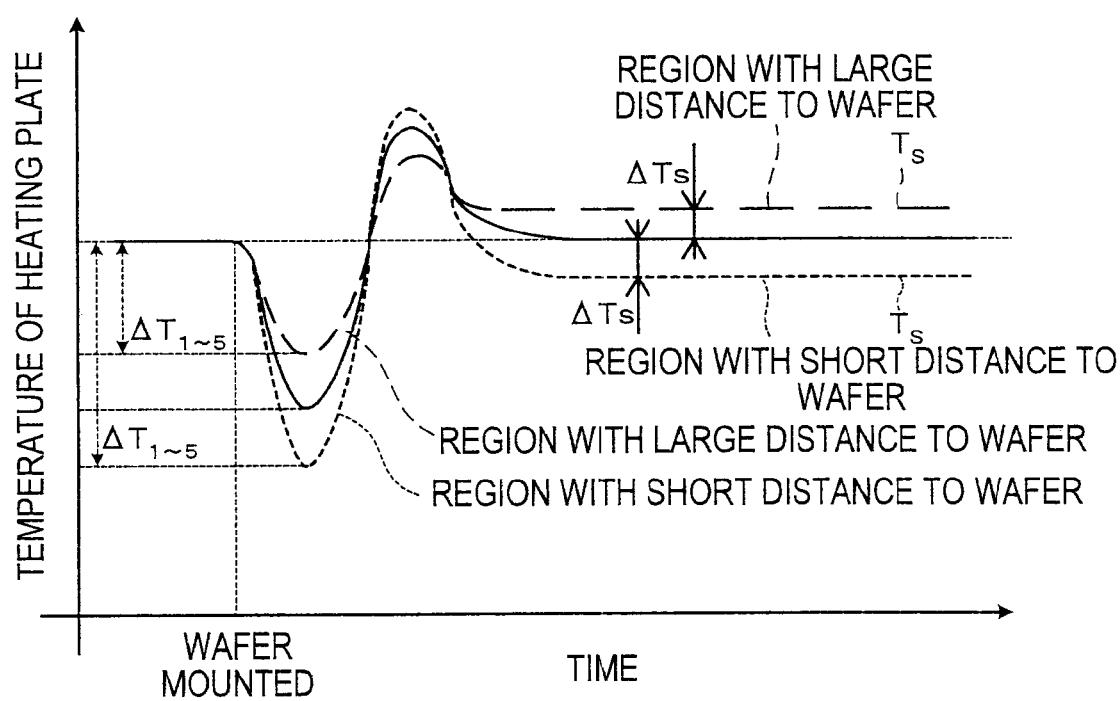
FIG. 16 is a graph showing temperature fluctuations of the heating plate during heat processing at new temperature settings.

Thereafter, the information of the correction values $\Delta Ts_1$ to $\Delta Ts_5$ is outputted from the communication unit 204 to the heater controller 142, so that the heater controller 142 changes the correction values $\Delta Ts_1$ to $\Delta Ts_5$ for the set temperatures Ts of the heating plate regions $R_1$ to $R_5$ of the heating plate 140 to set new set temperatures Ts for the heating plate regions $R_1$ to $R_5$ (Step Q4 in FIG. 15). This makes the set temperature Ts of a region R having a large distance between the wafer W and the heating plate 140 due to the warpage of the wafer W higher than the set temperature Ts of a region R having a small distance, for example, as shown in FIG. 16. For example, when the warpage of the wafer W is concave, the set temperatures Ts of the heating plate regions $R_2$ to $R_5$ are higher than that of the heating plate region $R_1$, and when the warpage of the wafer W is convex, the set temperature Ts of the heating plate region $R_1$ is higher than those of the heating plate regions $R_2$ to $R_5$.

The new temperature setting is performed immediately after the wafer W is mounted on the heating plate 140 in the PEB unit 84 and before the wafer W is brought to the steady temperature, so that the wafer W is heat-processed at the new temperature setting after the change.

According to the above embodiment, the warped state of the wafer W can be detected from the temperature drop amounts $\Delta T_1$ to $\Delta T_5$ of the regions $R_1$ to $R_5$ of the heating plate 140 on which the wafer W is mounted, thus eliminating the need to use a dedicated warpage measuring unit to accordingly reduce the cost. Further, the absence of the warpage measuring unit increases the space for mounting apparatuses in the coating and developing treatment system 1, so that other apparatuses can be mounted in that increased space to improve, for example, the throughput of the wafer processing. Further, since the warpage of the wafer W when it is actually mounted on the heating plate 140 can be detected, the warpage can be detected with accuracy as compared to the case using the separate warpage measuring unit so that the correction values $\Delta Ts$ of the set temperatures according to the warpage can be accurately calculated. As a result of this, the temperature control of the heating plate regions $R_1$ to $R_5$ of the heating plate 140 can be appropriately performed. Moreover, since the steady temperatures Tf are made uniform within the wafer during the heat processing, the accumulated heating values within the wafer affecting the line width are made uniform to improve the uniformity in processing state, for example, the line width within the wafer.

Further, since the correction values $\Delta Ts$ of the set temperatures are calculated immediately after the wafer W is mounted on the heating plate 140 and the heating plate 140 is set to new temperatures to perform heat processing for the wafer W, temperature control corresponding to the warped state specific to each wafer can be conducted to heat-process each wafer W. Accordingly, the uniformity in line width within the wafer can be further improved.

While the set temperatures Ts of the heating plate regions $R_1$ to $R_5$ are controlled based on the temperature drop amounts $\Delta T_1$ to $\Delta T_5$ of the heating plate regions $R_1$ to $R_5$ when the wafer W is mounted on the heating plate 140 in the above embodiment, transition temperatures of the wafer W may be controlled based on the temperature drop amounts $\Delta T_1$ to $\Delta T_5$ of the heating plate regions $R_1$ to $R_5$. As shown in FIG. 10, the transition temperature Ti is a temperature during a temperature varying period H2 from the time when the wafer W at a low temperature is mounted on the heating plate 140 until it is stabilized at the steady temperature Tf.

In this case, for example, a correlation III between the temperature drop amount of the heating plate 140 when the wafer is mounted on the heating plate 140 and the transition temperature Ti of the wafer W is obtained in advance. The correlation III is obtained, for example, from the correlation between the temperature drop amount of the heating plate 140 and the warpage of the wafer W and the correlation between the warpage amount of the wafer W and the transition temperature Ti of the wafer W.

FIG. 17 is a flowchart showing the temperature control process in that case. When the wafer W is transferred into the PEB unit 84 and mounted on the heating plate 140, the temperature drop amounts $\Delta T_1$ to $\Delta T_5$ of the heating plate regions $R_1$ to $R_5$ are detected to detect the warped state of the wafer W (Step P1 in FIG. 17). The transition temperatures $Ti_1$ to $Ti_5$ of the wafer regions $W_1$ to $W_5$ (the transition temperatures within the wafer) are estimated using the correlation III from the temperature drop amounts $\Delta T_1$ to $\Delta T_5$ (Step P2 in FIG. 17). The correction values for the output control of the heaters 141 of the heating plate regions $R_1$ to $R_5$ to eliminate the differences between the estimated transition temperatures $Ti_1$ to $Ti_5$ of the wafer regions $W_1$ to $W_5$ are calculated as shown in FIG. 18 (Step P3 in FIG. 17). More specifically, an inverse function of the correlation III between the temperature drop amount of the heating plate 140 and the transition temperature Ti of the wafer W is obtained, and the inverse function can be used to obtain the correction values of the heater output control of the regions $R_1$ to $R_5$ from the temperature drop amounts $\Delta T_1$ to $\Delta T_5$. The calculation of the correction values for the heater output control from the temperature drop amounts $\Delta T_1$ to $\Delta T_5$ is performed, for example, by the program stored in the program storage unit 203 of the control nit 191.

The information on the calculated correction values for the heater output control of the heating plate regions $R_1$ to $R_5$ is outputted to the heater controller 142 to change the settings of the output control of the heaters 141 and set new output control (Step P4 in FIG. 17). Thus, the transition temperatures Ti of the regions $W_1$ to $W_5$ of the wafer W heated on the heating plate 140 are made uniform.

In this case, since the accumulated heating values within the wafer affecting the line width are made uniform by making the transition temperatures Ti uniform within the wafer, thereby improving the uniformity within the wafer. Note that either or both the set temperatures Ts and the transition temperatures Ti of the wafer W may be controlled based on the temperature drop amounts $\Delta T_1$ to $\Delta T_5$ of the heating plate regions $R_1$ to $R_5$. By controlling both of them, the accumulated heating values within the wafer during the heat processing are made more uniform to improve the uniformity in line width within the wafer.

While the temperature drop amounts of the heating plate regions $R_1$ to $R_5$ are detected in the PEB unit 84, and new set temperatures are set immediately thereafter in order to heat-process the wafer W in the above embodiment, the temperature control of the heating plate 140 of the PEB unit 84 may be conducted by detecting the temperature drop amounts by a heat processing plate of another heat processing unit for performing heat processing prior to the aforementioned heat processing to detect the warpage of the wafer W.

For example, the temperature control may be conducted in the heat processing unit for performing heat processing after the bottom coating or in the pre-baking unit for performing heat processing after the resist coating. The heat processing unit and the pre-baking unit in this case have the same configuration as that of the PEB unit 84, in each of which a temperature sensor is provided in each of the heating plate regions of the heating plate. In a series of photolithography process, when the wafer W is transferred, for example, to the pre-baking unit and mounted on the heating plate, the temperature drop amounts of the heating plate regions are detected. This data is outputted to the control unit 191 so that the temperature correction values of the heating plate regions $R_1$ to $R_5$ in the PEB unit 84 are calculated, for example, using the correlation I or the like as in the above embodiment. The temperature settings of the heating plate 140 of the PEB unit 84 are then changed and the wafer W is heat-processed at the temperature settings.

In this case, it is not necessary to use the warpage measuring unit, so that the apparatus cost can be reduced. Besides, the warpage of the wafer W is detected from the temperature drop amounts when it is mounted on the actual heating plate, and the temperature control corresponding to the warpage is conducted, so that the uniformity in the line width within the wafer can be improved. Note that in a series of the photolithography process, in the case where the resist film is formed and top-coating of forming a film such as an anti-reflection film on the top of the resist film is performed and then heat processing is performed, the temperature drop amounts of the regions of the heating plate may be detected in that heat processing. Besides, the detection of the temperature drop amounts may be performed using the heating plate of a dedicated heat processing unit for detecting the temperature drop amounts incorporated in the coating and developing treatment system 1.

A preferred embodiment of the present invention has been described above with reference to the accompanying drawings, but the present invention is not limited to the embodiment. It should be understood that various changes and modifications are readily apparent to those skilled in the art within the scope of the spirit as set forth in claims, and those should also fall within the technical scope of the present invention.

For example, while temperature control of the heating plate 140 is conducted for each wafer W by detecting its warpage in the above embodiment, temperature control of the heating plate 140 may be conducted for each lot composed of a plurality of wafers.

For example, the heating plate 140 to be controlled in temperature is divided into five regions in the above embodiment, but the number of regions can be arbitrarily selected. Further, the shapes of the divided regions of the heating plate 140 can be arbitrarily selected.

While the above embodiment is an example of conducting the temperature control of the heating plate 140 in the PEB unit 84, the present invention is also applicable to temperature control of a heating plate for performing other heat processing located in a pre-baking unit or a post-baking unit, and temperature control of a cooling plate for cooling the wafer W in a cooling processing unit. Further, while the temperature control of the heating plate is conducted so that the line width within the wafer is finally uniform in the above embodiment, the temperature control of the heat processing plates of the PEB unit, pre-baking unit, and pos-baking unit may be conducted so that processing state within the wafer other than the line width, such as the angle of side wall (side-wall angle) in the groove of the resist pattern, and the film thickness of the resist pattern is uniform within the wafer. Besides, while the temperature control of the heating plate is conducted so that the line width of the pattern after the photolithography process and before the etching process is uniform in the above embodiment, the temperature control of the heat processing plates may be conducted so that the line width of the pattern or the side-wall angle after the etching process is uniform. Furthermore, the present invention is also applicable to temperature control of a heat processing plate for heat-processing substrates other than the wafer, such as an FPD (Flat Panel Display), a mask reticle for a photomask, and the like.

What is claimed is:

1. A temperature control apparatus of a heat processing plate for mounting and heat-processing a substrate thereon,
   said heat processing plate being divided into a plurality of heating plate regions and temperature-controllable for each of the heating plate regions, said apparatus comprising:
   a detecting unit for detecting temperature drop amounts within said heat processing plate when the substrate is mounted on said heat processing plate to detect a warped state of the substrate, the detecting unit including a plurality of temperature sensors each being disposed on a rear surface of the heat processing plate, without penetrating the heat processing plate, and each disposed beneath a respective location of each of the heating plate regions; and
   a control unit for controlling temperatures of the regions of said heat processing plate based on the warped state of the substrate.

2. The temperature control apparatus of a heat processing plate as set forth in claim 1,
   wherein said control unit calculates correction values for set temperatures of the regions of said heat processing plate from the temperature drop amounts within said heat processing plate, and corrects the set temperatures of the regions based on the correction values.

3. The temperature control apparatus of a heat processing plate as set forth in claim 2,
wherein said control unit uses a correlation between the temperature drop amount of said heat processing plate when the substrate is mounted thereon and a steady temperature of the substrate when the substrate is heat-processed on said heat processing plate to estimate steady temperatures within the substrate from the temperature drop amounts within said heat processing plate, and calculates the correction values for the set temperatures of the regions from the estimated steady temperatures within the substrate.

4. The temperature control apparatus of a heat processing plate as set forth in claim 3,
wherein the correlation between the temperature drop amount of said heat processing plate and the steady temperature of the substrate on said heat processing plate is obtained from a correlation between the temperature drop amount of said heat processing plate and a warpage amount of the substrate and a correlation between the warpage amount of the substrate and the steady temperature of the substrate on said heat processing plate.

5. The temperature control apparatus of a heat processing plate as set forth in claim 1,
wherein in the heat processing performed on said heat processing plate,
immediately after one substrate is mounted on said heat processing plate, the temperature drop amounts within said heat processing plate are detected to detect a warped state of the one substrate, the temperatures of the regions of said heat processing plate are controlled based on the warped state of the one substrate, and the one substrate is then heat-processed on said heat processing plate.

6. A temperature control apparatus of a heat processing plate for mounting and heat-processing a substrate thereon, said heat processing plate being divided into a plurality of regions and temperature-controllable for each of the regions, said apparatus comprising:
a detecting unit for detecting temperature drop amounts within said heat processing plate when the substrate is mounted on said heat processing plate to detect a warped state of the substrate; and
a control unit for controlling temperatures of the regions of said heat processing plate based on the warped state of the substrate,
wherein said control unit is configured to control transition temperatures within the substrate from a time when the substrate is mounted on said heat processing plate until the substrate reaches a steady temperature, based on the detected temperature drop amounts within said heat processing plate.

7. The temperature control apparatus of a heat processing plate as set forth in claim 6,
wherein said control unit calculates correction values for set temperatures of the regions of said heat processing plate from the temperature drop amounts within said heat processing plate, and corrects the set temperatures of the regions based on the correction values.

8. The temperature control apparatus of a heat processing plate as set forth in claim 7,
wherein said control unit uses a correlation between the temperature drop amount of said heat processing plate when the substrate is mounted thereon and the steady temperature of the substrate when the substrate is heat-processed on said heat processing plate to estimate steady temperatures within the substrate from the temperature drop amounts within said heat processing plate, and calculates the correction values for the set temperatures of the regions from the estimated steady temperatures within the substrate.

9. The temperature control apparatus of a heat processing plate as set forth in claim 8,
wherein the correlation between the temperature drop amount of said heat processing plate and the steady temperature of the substrate on said heat processing plate is obtained from a correlation between the temperature drop amount of said heat processing plate and a warpage amount of the substrate and a correlation between the warpage amount of the substrate and the steady temperature of the substrate on said heat processing plate.

10. The temperature control apparatus of a heat processing plate as set forth in claim 6,
wherein in the heat processing performed on said heat processing plate,
immediately after one substrate is mounted on said heat processing plate, the temperature drop amounts within said heat processing plate are detected to detect a warped state of the one substrate, the temperatures of the regions of said heat processing plate are controlled based on the warped state of the one substrate, and the one substrate is then heat-processed on said heat processing plate.

11. A temperature control apparatus of a heat processing plate for mounting and heat-processing a substrate thereon, said heat processing plate being divided into a plurality of regions and temperature-controllable for each of the regions, said apparatus comprising:
a detecting unit for detecting temperature drop amounts within said heat processing plate when the substrate is mounted on said heat processing plate to detect a warped state of the substrate; and
a control unit for controlling temperatures of the regions of said heat processing plate based on the warped state of the substrate,
wherein said control unit is configured to control accumulated heating values of the substrate mounted on said heat processing plate to be uniform within the substrate.

12. The temperature control apparatus of a heat processing plate as set forth in claim 11,
wherein said control unit calculates correction values for set temperatures of the regions of said heat processing plate from the temperature drop amounts within said heat processing plate, and corrects the set temperatures of the regions based on the correction values.

13. The temperature control apparatus of a heat processing plate as set forth in claim 12,
wherein said control unit uses a correlation between the temperature drop amount of said heat processing plate when the substrate is mounted thereon and a steady temperature of the substrate when the substrate is heat-processed on said heat processing plate to estimate steady temperatures within the substrate from the temperature drop amounts within said heat processing plate, and calculates the correction values for the set temperatures of the regions from the estimated steady temperatures within the substrate.

14. The temperature control apparatus of a heat processing plate as set forth in claim 13,
wherein the correlation between the temperature drop amount of said heat processing plate and the steady temperature of the substrate on said heat processing plate is obtained from a correlation between the temperature drop amount of said heat processing plate and a warpage amount of the substrate and a correlation between the warpage amount of the substrate and the steady temperature of the substrate on said heat processing plate.

15. The temperature control apparatus of a heat processing plate as set forth in claim 11,
wherein in the heat processing performed on said heat processing plate,
immediately after one substrate is mounted on said heat processing plate, the temperature drop amounts within said heat processing plate are detected to detect a warped state of the one substrate, the temperatures of the regions of said heat processing plate are controlled based on the warped state of the one substrate, and the one substrate is then heat-processed on said heat processing plate.

16. A temperature control apparatus of a heat processing plate for mounting and heat-processing a substrate thereon, said heat processing plate being divided into a plurality of regions and temperature-controllable for each of the regions, said apparatus comprising:
a detecting unit for detecting temperature drop amounts within said heat processing plate when the substrate is mounted on said heat processing plate to detect a warped state of the substrate; and
a control unit for controlling temperatures of the regions of said heat processing plate based on the warped state of the substrate,
wherein when in a series of substrate processing having another heat processing, prior to one heat processing in which temperature control of said heat processing plate is conducted, and
when the substrate is mounted on said heat processing plate in the other heat processing, the detecting unit is configured to detect the temperature drop amounts of said heat processing plate to detect a warped state of the substrate, and the control unit is configured to control the temperatures of the regions of said heat processing plate in the one heat processing based on the warped state of the substrate.

17. The temperature control apparatus of a heat processing plate as set forth in claim 16,
wherein said control unit calculates correction values for set temperatures of the regions of said heat processing plate from the temperature drop amounts within said heat processing plate, and corrects the set temperatures of the regions based on the correction values.

18. The temperature control apparatus of a heat processing plate as set forth in claim 17,
wherein said control unit uses a correlation between the temperature drop amount of said heat processing plate when the substrate is mounted thereon and a steady temperature of the substrate when the substrate is heat-processed on said heat processing plate to estimate steady temperatures within the substrate from the temperature drop amounts within said heat processing plate, and calculates the correction values for the set temperatures of the regions from the estimated steady temperatures within the substrate.

19. The temperature control apparatus of a heat processing plate as set forth in claim 18,
wherein the correlation between the temperature drop amount of said heat processing plate and the steady temperature of the substrate on said heat processing plate is obtained from a correlation between the temperature drop amount of said heat processing plate and a warpage amount of the substrate and a correlation between the warpage amount of the substrate and the steady temperature of the substrate on said heat processing plate.

20. The temperature control apparatus of a heat processing plate as set forth in claim 16,
wherein in the heat processing performed on said heat processing plate,
immediately after one substrate is mounted on said heat processing plate, the temperature drop amounts within said heat processing plate are detected to detect a warped state of the one substrate, the temperatures of the regions of said heat processing plate are controlled based on the warped state of the one substrate, and the one substrate is then heat-processed on said heat processing plate.

* * * * *